(12) United States Patent
Saitoh

(10) Patent No.: US 9,824,942 B2
(45) Date of Patent: Nov. 21, 2017

(54) METHOD OF MANUFACTURING THIN-FILM TRANSISTOR SUBSTRATE INCLUDING A COPPER ALLOY FILM

(71) Applicant: JOLED INC., Tokyo (JP)

(72) Inventor: Tohru Saitoh, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/304,060

(22) PCT Filed: Dec. 22, 2014

(86) PCT No.: PCT/JP2014/006377
§ 371 (c)(1),
(2) Date: Oct. 13, 2016

(87) PCT Pub. No.: WO2015/159328
PCT Pub. Date: Oct. 22, 2015

(65) Prior Publication Data
US 2017/0040234 A1    Feb. 9, 2017

(30) Foreign Application Priority Data

Apr. 15, 2014   (JP) ................. 2014-084036

(51) Int. Cl.
| | | |
|---|---|---|
| H01L 21/66 | (2006.01) | |
| H01L 51/50 | (2006.01) | |
| G09F 9/30 | (2006.01) | |
| H01L 21/28 | (2006.01) | |
| H01L 29/786 | (2006.01) | |
| H01L 21/02 | (2006.01) | |
| H01L 21/441 | (2006.01) | |

(Continued)

(52) U.S. Cl.
CPC ............... *H01L 22/20* (2013.01); *G09F 9/30* (2013.01); *H01L 21/02068* (2013.01); *H01L 21/28* (2013.01); *H01L 21/441* (2013.01); *H01L 29/45* (2013.01); *H01L 29/66969* (2013.01); *H01L 29/786* (2013.01); *H01L 29/7869* (2013.01); *H01L 51/50* (2013.01)

(58) Field of Classification Search
CPC combination set(s) only.
See application file for complete search history.

(56) References Cited

U.S. PATENT DOCUMENTS

2008/0315203 A1   12/2008   Hino et al.
2015/0115264 A1*   4/2015   Kato ................. H01L 29/45
                                          257/43

FOREIGN PATENT DOCUMENTS

| JP | 2000-165002 A | 6/2000 |
|---|---|---|
| JP | 2000-282033 A | 10/2000 |
| JP | 2009-4518 A | 1/2009 |

(Continued)

OTHER PUBLICATIONS

International Search Report in PCT/JP2014/006377, dated Feb. 10, 2015.

(Continued)

*Primary Examiner* — Mamadou Diallo
(74) *Attorney, Agent, or Firm* — Hauptman Ham, LLP

(57) ABSTRACT

A method of manufacturing a thin-film transistor (TFT) substrate including a thin-film transistor having a CuMn alloy film. The method includes controlling a contact resistance of a surface of the CuMn alloy film on the basis of a contact angle of the surface of the CuMn alloy film.

19 Claims, 15 Drawing Sheets

(51) Int. Cl.
    *H01L 29/45*             (2006.01)
    *H01L 29/66*             (2006.01)

(56) References Cited

FOREIGN PATENT DOCUMENTS

| | | |
|---|---|---|
| JP | 2010-27584 A | 2/2010 |
| JP | 2012-27159 A | 2/2012 |
| JP | 2012-109560 A | 6/2012 |
| JP | 2012-243779 A | 12/2012 |
| JP | 2013-4958 A | 1/2013 |
| WO | 2013/187046 A1 | 12/2013 |

OTHER PUBLICATIONS

Office Action in JP Application No. 2016-513500, dated Aug. 29, 2017, 3pp.

* cited by examiner

METHOD OF MANUFACTURING THIN-FILM TRANSISTOR SUBSTRATE INCLUDING A COPPER ALLOY FILM

RELATED APPLICATIONS

The present application is a National Phase of International Application Number PCT/JP2014/006377, filed Dec. 22, 2014, which claims priority to Japanese Application Number 2014-084036, filed Apr. 15, 2014.

TECHNICAL FIELD

The present disclosure relates to a method of manufacturing a thin-film transistor substrate.

BACKGROUND ART

Active matrix display devices, such as liquid crystal display devices and organic electroluminescent (EL) display devices, include a thin-film transistor (TFT) substrate in which TFTs are formed as switching elements or drive elements. For example, Patent Literature (PTL) 1 describes an active matrix organic EL display device including a TFT substrate.

Structures of the TFT include a bottom-gate TFT in which a gate electrode is disposed in a lower part (substrate side) of a channel layer, and a top-gate TFT in which a gate electrode is disposed in an upper part of the channel layer. For example, a silicon semiconductor or an oxide semiconductor is used as the channel layer of the TFT.

In the TFT substrate (TFT array substrate) which includes a plurality of pixels arranged in a matrix, a plurality of lines through which a signal (voltage) for driving each of the pixels is transmitted are disposed.

In recent years, due to an increase in size of a substrate following an increase in screen size of a display device, the length of lines in the TFT substrate has increased, leading to an increase in wiring resistance. For that reason, there is a demand for reducing wiring resistance.

The lines are formed using the same materials as materials of a source electrode or a drain electrode of the TFT and in the same layer as the source electrode or the drain electrode of the TFT. For that reason, the source electrode or the drain electrode is required to have a function of not only the TFT but also the line.

In view of the above, it is under consideration to employ copper (Cu) which has low resistivity as the material of the source electrode or the drain electrode, and the line.

However, Cu has low adhesion to an insulating film (interlayer insulation film) of a silicon oxide etc. In view of this, a technique of forming a Cu alloy film such as a CuMn film between a Cu line or a Cu electrode and the insulating film has been proposed (for example, PTL 1).

CITATION LIST

Patent Literature

[PTL 1] Japanese Unexamined Patent Application Publication No. 2010-27584

SUMMARY OF INVENTION

Technical Problem

In a TFT substrate, a line or an electrode which is covered by an insulating film (interlayer insulation film) is electrically connected to other electrodes or lines via a contact hole formed through the insulating film. For example, in the case where the source electrode or the drain electrode or a source line has a stack structure of a Cu film and a CuMn alloy film, a contact hole is formed through an insulating film on the CuMn alloy film to expose a surface of the CuMn alloy film, and a conductive film is formed on the insulating film to cover the contact hole, thereby causing the CuMn alloy film and the conductive film to be in contact with each other.

Contact resistance is generated on the CuMn alloy film, by exposing the surface of the CuMn alloy film. However, there is no existing technique to control the contact resistance, posing a problem that it is difficult to implement a TFT substrate with desired performance.

The technique disclosed herein has an object of providing a TFT substrate with desired performance.

Solution to Problem

In order to achieve the aforementioned object, one aspect of a method of manufacturing a thin-film transistor substrate according to the present disclosure is a method of manufacturing a thin-film transistor substrate including a thin-film transistor having a CuMn alloy film, the method including: forming the CuMn alloy film; and controlling a contact resistance of a surface of the CuMn alloy film on a basis of a contact angle of the surface of the CuMn alloy film.

Advantageous Effects of Invention

It is possible to implement a TFT substrate with desired performance.

DESCRIPTION OF EMBODIMENTS

Hereinafter, an embodiment of the present disclosure shall be described with reference to the Drawings. It should be noted that the subsequently-described embodiment shows a specific preferred example of the present invention. Therefore, numerical values, shapes, materials, structural components, the arrangement and connection of the structural components, steps, the processing order of the steps etc. shown in the following exemplary embodiment are mere examples, and are not intended to limit the scope of the present invention. Furthermore, among the structural components in the following exemplary embodiment, components not recited in the independent claim which indicates the broadest concept of the present invention are described as arbitrary structural components.

In addition, each of the diagrams is a schematic diagram and thus is not necessarily strictly illustrated. In each of the diagrams, substantially the same structural components are assigned with the same reference signs, and redundant descriptions will be omitted or simplified.

Embodiment

First, a structure of an organic EL display device shall be described as an example of a display device which includes a TFT substrate.

[Organic EL Display Device]

Figure 1:
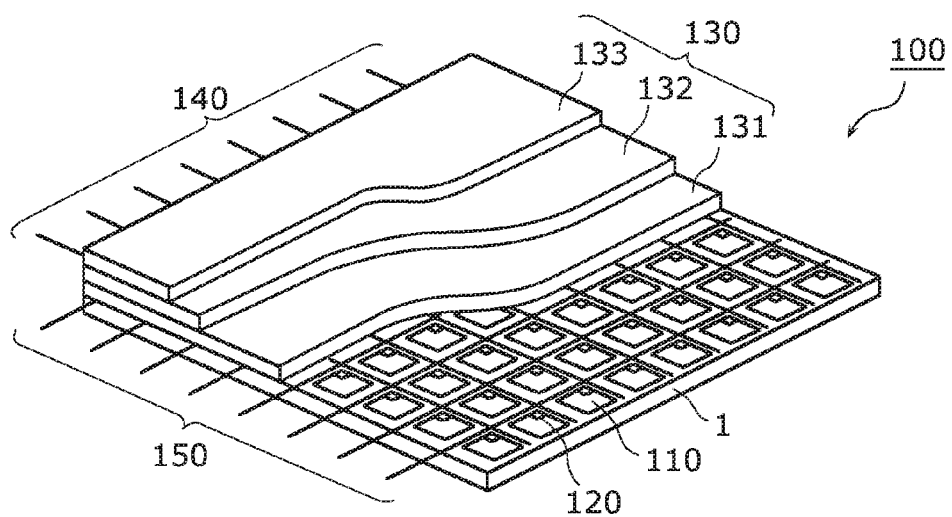
FIG. 1 is a partially cutaway perspective view of an organic EL display device according to an embodiment.
Figure 2:
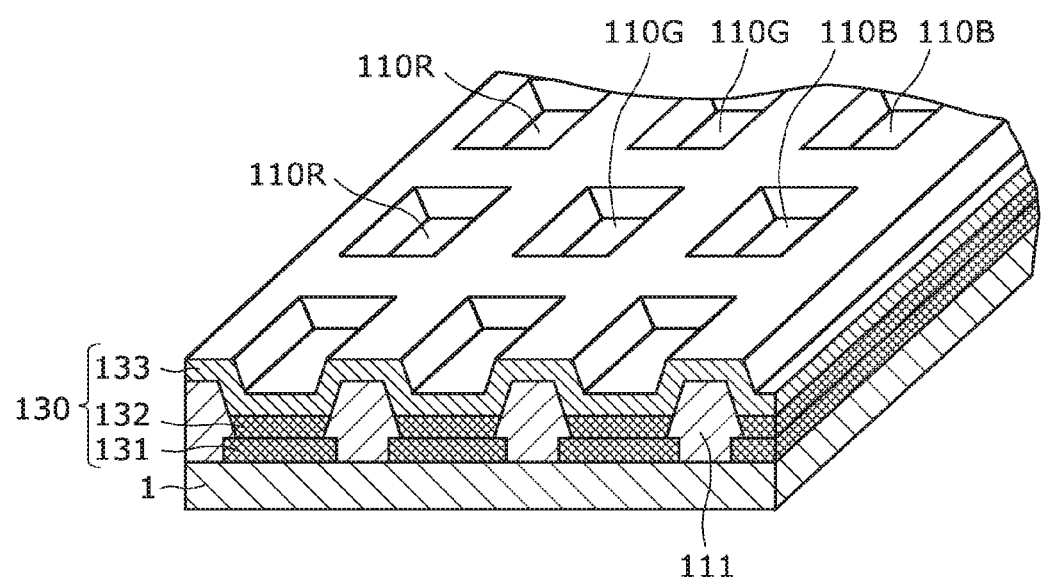
FIG. 2 is a perspective view illustrating an example of pixel banks of the organic EL display device according to the embodiment.

FIG. 1 is a partially cutaway perspective view of an organic EL display device according to an embodiment. FIG. 2 is a perspective view of an example of pixel banks of the organic EL display device according to the embodiment.

As illustrated in FIG. 1, the organic EL display device 100 has a stack structure of a TFT substrate (TFT array substrate) 1 and an organic EL element (light emitting part) 130. The TFT substrate 1 has a plurality of thin-film transistors arranged therein. The organic EL element 130 includes an anode 131 which is a lower electrode, an EL layer 132 which is a light emitting layer formed of an organic material, and a cathode 133 which is a transparent upper electrode.

The organic EL display device 100 according to the present embodiment is a top emission type, and the anode 131 is a reflection electrode. It should be noted that the organic EL display device 100 is not limited to the top emission type, and may be a bottom emission type.

A plurality of pixels 110 are arranged in the TFT substrate 1 in a matrix. Each pixel 110 is provided with a pixel circuit 120.

The organic EL element 130 is formed in association with each of the plurality of pixels 110. The pixel circuit 120 in each pixel 110 controls the light emission of the corresponding organic EL element 130. The organic EL elements 130 are formed on an interlayer insulation film (planarizing layer) that is formed to cover the plurality of thin-film transistors.

Each organic EL element 130 has the EL layer 132 between the anode 131 and the cathode 133. In addition, a hole transport layer is disposed between the anode 131 and the EL layer 132, and an electron transport layer is disposed between the EL layer 132 and the cathode 133. It should be noted that any other functional layer(s) may be disposed between the anode 131 and the cathode 133.

Each pixel 110 is driven by the corresponding pixel circuit 120. In the TFT substrate 1, a plurality of gate lines (scan lines) 140 are arranged along the row direction of the pixels 110, a plurality of source lines (signal lines) 150 are arranged along the column direction of the pixels 110 so as to intersect with the gate lines 140, and a plurality of power lines (not illustrated in FIG. 1) are arranged in parallel with the source lines 150. The pixels 110 are defined by, for example, the gate lines 140 and source lines 150 orthogonal to each other.

The gate lines 140 are each connected to the gate electrode of the thin-film transistor included in each pixel circuit 120 and operating as a switching element, on a row-by-row basis. The source lines 150 are each connected to the source electrode of the thin-film transistor included in each pixel circuit 120 and operating as a switching element, on a column-by-column basis. The power lines are each connected to the drain electrode of the thin-film transistor included in each pixel circuit 120 and operating as a drive element, on a column-by-column basis.

As illustrated in FIG. 2, each pixel 110 in the organic EL display device 100 is composed of subpixels 110R, 110G, and 110B of three colors (red, green, blue). The plurality of subpixels 110R, 110G, and 110B are arranged on a display surface in the form of a matrix.

The subpixels 110R, 110G, and 110B are separated from each other by banks 111. The banks 111 are formed in a grid so that projections lying in parallel with the gate lines 140 and projections lying in parallel with the source lines 150 intersect with each other. The portions enclosed by the projections (i.e. the openings of the banks 111) and the subpixels 110R, 110G, and 110B are in a one-to-one correspondence with each other. It should be noted that although the banks 111 are pixel banks in this embodiment, the banks 111 may be line banks.

The anode 131 is formed on the interlayer insulation film (planarizing layer) on the TFT substrate 1 and in the opening of the bank 111, for each of the subpixels 110R, 110G, and 110B. In the same manner, the EL layer 132 is formed on the anode 131 and in the opening of the bank 111, for each of the subpixels 110R, 110G, and 110B. The transparent cathode 133 is formed continuously on the plurality of banks 111 so as to cover all EL layers 132 (all subpixels 110R, 110G, and 110B).

The pixel circuit 120 is provided for each of the subpixels 110R, 110G, and 110B. Each of the subpixels 110R, 110G, and 110B and its corresponding pixel circuit 120 are electrically connected to each other by a contact hole and a relay electrode. It should be noted that the subpixels 110R, 110G, and 110B have the same structure except that the respective EL layers 132 emit different colors of light.

Figure 3:
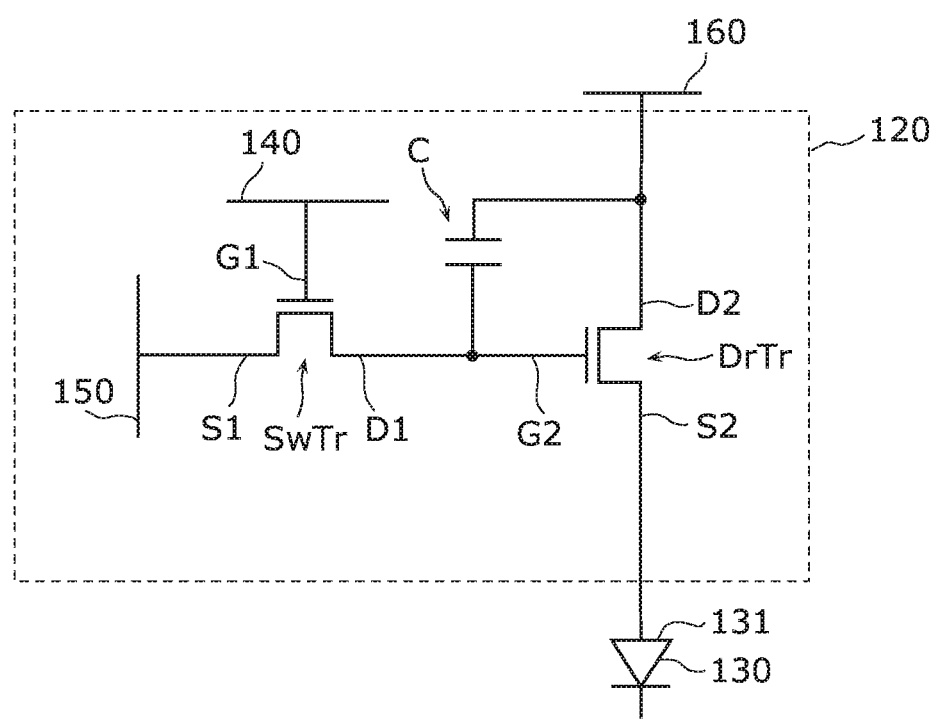
FIG. 3 is an electrical circuit diagram illustrating the structure of a pixel circuit in the organic EL display device according to the embodiment.

The circuit structure of the pixel circuit 120 in each pixel 110 is described below, with reference to FIG. 3. FIG. 3 is an electrical circuit diagram illustrating the structure of a pixel circuit in the organic EL display device according to the embodiment.

As illustrated in FIG. 3, the pixel circuit 120 includes a thin-film transistor SwTr that operates as a switching element, a thin-film transistor DrTr that operates as a drive element, and a capacitor C that stores data to be displayed at the corresponding pixel 110. In this embodiment, the thin-film transistor SwTr is a switching transistor for selecting the pixel 110, and the thin-film transistor DrTr is a drive transistor for driving the organic EL element 130.

The thin-film transistor SwTr has a gate electrode G1 connected to the gate line 140, a source electrode S1 connected to the source line 150, a drain electrode D1 connected to the capacitor C and the gate electrode G2 of the thin-film transistor DrTr, and a semiconductor film (not illustrated). When a predetermined voltage is applied to the gate line 140 and the source line 150 to which the thin-film transistor SwTr is connected, the voltage applied to the source line 150 is stored in the capacitor C as a data voltage.

The thin-film transistor DrTr has a gate electrode G2 connected to the drain electrode D1 of the thin-film transistor SwTr and the capacitor C, a drain electrode D2 connected to the power line 160 and the capacitor C, a source electrode S2 connected to the anode 131 of the organic EL element 130, and a semiconductor film (not illustrated). The thin-film transistor DrTr supplies the current corresponding to the data voltage stored in the capacitor C, from the power line 160 to the anode 131 of the organic EL element 130 via the source electrode S2. As a result, the drive current flows from the anode 131 to cathode 133 in the organic EL element 130, and the EL layer 132 emits light.

It should be noted that the organic EL display device 100 having the structure described above is an active matrix display device which controls display for each pixel 110 located at a different one of the intersections of the gate lines 140 and source lines 150.

The thin-film transistor SwTr and the thin-film transistor DrTr in each pixel 110 (each of the subpixels 110R, 110G, and 110B) cause the corresponding organic EL element 130 to emit light selectively, as a result of which a desired image is displayed.

[Thin-film transistor Substrate]

Figure 4:
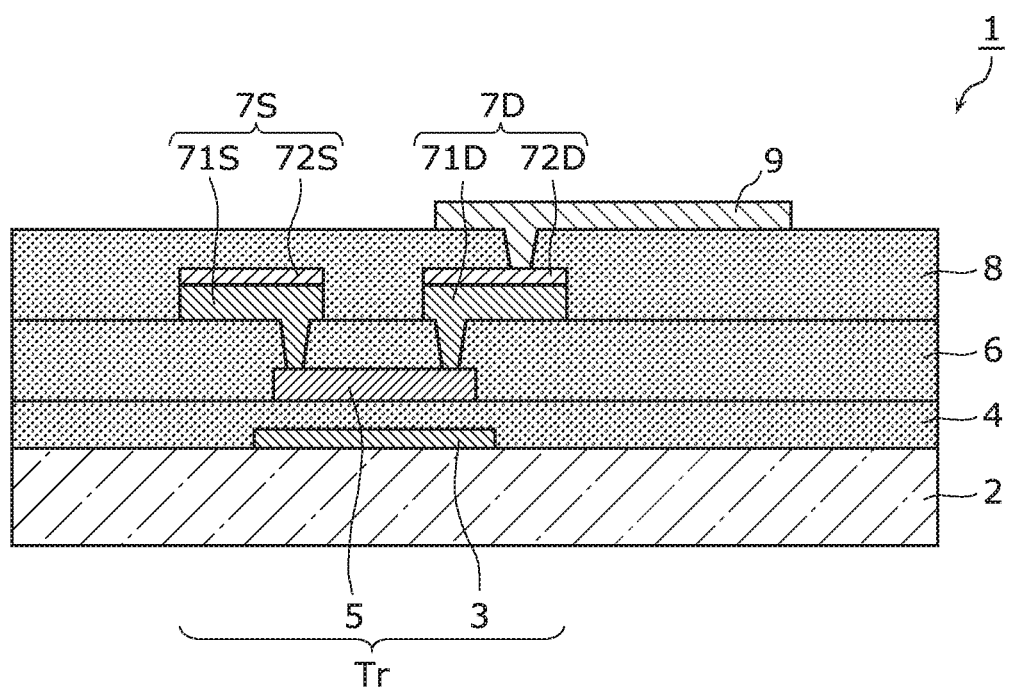
FIG. 4 is a schematic sectional view of a TFT substrate according to the embodiment.

The following describes the TFT substrate according to the embodiment, with reference to FIG. 4. FIG. 4 is a schematic sectional view of the TFT substrate according to the embodiment. The TFT substrate 1 in the aforementioned organic EL display device 100 is described in the following embodiment. It should be noted that the thin-film transistor Tr according to the embodiment is applicable to both the above-described thin-film transistor SWTr (switching transistor) and the above-described thin-film transistor DrTr (drive transistor).

As illustrated in FIG. 4, the TFT substrate 1 includes: a substrate 2; a gate electrode 3; a gate insulating film 4 (first insulating film); an oxide semiconductor layer 5; an insulating layer 6 (second insulating film); a source electrode 7S; a drain electrode 7D; an insulating layer 8 (third insulating film); and an upper-layer wiring 9.

The gate electrode 3, the source electrode 7S and the drain electrode 7D, and the upper-layer wiring 9 are each formed of a metal material, and a layer in which each of these electrodes and the line is formed is a metal layer (wiring layer). More specifically, the layer in which the gate electrode 3 is formed is the first wiring layer (first metal layer), the layer in which the source electrode 7S and the drain electrode 7D are formed is the second wiring layer (second metal layer), and the layer in which the upper-layer wiring 9 is formed is the third wiring layer (third metal layer).

As described above, the TFT substrate 1 according to the embodiment has three wiring layers, and each metal layer can be used as a wiring layer for forming various lines. More specifically, by patterning a metal film (conductive film) formed on each metal layer into a predetermined shape, it is possible to form a desired interconnecting line or electrode having a predetermined shape, in addition to the above-described electrodes and line. For example, the gate line 140, the source line 150, and the power line 160 illustrated in FIG. 1 are formed in each of the metal layer. In addition, a contact hole is formed through an insulating layer between the upper and lower metal layers, for connecting the lines in each of the metal layers, or for connecting the lines and the electrodes.

As illustrated in FIG. 4, the thin-film transistor Tr includes: the gate electrode 3; the gate insulating film 4; the oxide semiconductor layer 5; the source electrode 7S, and the drain electrode 7D, in the TFT substrate 1. The gate electrode 3, the source electrode 7S, and the drain electrode 7D correspond to the gate electrode G2, the source electrode S2, and the drain electrode D2 in FIG. 3, respectively. The thin-film transistor Tr according to the present embodiment is a bottom-gate TFT.

Each structural component in the TFT substrate 1 is described in detail below, with reference to FIG. 4.

The substrate 2 is a glass substrate such as a G8 substrate, for example. It should be noted that the substrate 2 may be a flexible substrate such as a resin substrate. An undercoat layer may be formed on the surface of the substrate 2.

The gate electrode 3 is formed in a predetermined shape, above the substrate 2. As the gate electrode 3, for example, a metal such as titanium (Ti), molybdenum (Mo), tungsten (W), aluminum (Al), gold (Au), and copper (Cu), or a conductive oxide such as indium tin oxide (ITO) is used. In addition, as to the metal, an alloy such as a molybdenum-tungsten alloy (MoW) may be used as the gate electrode 3. Moreover, in order to enhance film adhesion, a stack structure in which a metal such as Ti, Al, or Au as metal having good adhesion to an oxide is sandwiched may be used as the gate electrode 3.

The gate insulating layer 4 is formed between the gate electrode 3 and the oxide semiconductor layer 5. The gate insulating film 4 is formed above the substrate 2 to cover the gate electrode 3. The gate insulation film 4 is, for example, a single-layer film of an oxide thin film such as a silicon oxide film or a hafnium oxide film, a nitride film such as a silicon nitride film, or a silicon oxynitride film, or a stack of these films.

The oxide semiconductor layer 5 is formed in a predetermined shape, above the substrate 2. The oxide semiconductor layer 5 is the channel layer (semiconductor layer) of the thin-film transistor Tr, and faces the gate electrode 3. For example, the oxide semiconductor layer 5 is formed in the shape of an island on the gate insulating layer 4 above gate electrode 3.

The oxide semiconductor layer 5 is desirably made of a transparent amorphous oxide semiconductor (TAOS) such as $InGaZnO_x$ (IGZO) containing In—Ga—Zn—O. A thin-film transistor having the transparent amorphous oxide semiconductor as its channel layer has high carrier mobility, and is suitable for large-screen, high-resolution display devices. The transparent amorphous oxide semiconductor is also capable of low-temperature deposition, and so can be formed easily on a flexible substrate.

For example, the amorphous oxide semiconductor of $InGaZnO_x$ can be deposited by vapor-phase deposition such as sputtering or laser deposition using, as a target, a polycrystalline sintered body having a composition of $InGaO_3(ZnO)_4$.

The insulating layer 6 is deposited on the gate insulating layer 4 to cover the oxide semiconductor layer 5. In other words, the oxide semiconductor layer 5 is covered by the insulating layer 6, and the insulating layer 6 serves as a protection layer (channel protection layer) which protects the oxide semiconductor layer 5. The insulating layer 6 is, for example, a single-layer film such as a silicon oxide ($SiO_2$) film or an aluminum oxide ($Al_2O_3$) film, or a stack of these oxide films. A portion of the insulating layer 6 has an opening that passes through the insulating layer 6, and the oxide semiconductor layer 5 is connected to the source electrode 7S and the drain electrode 7D via the opening (contact hole).

The source electrode 7S and the drain electrode 7D are formed in a predetermined shape on the insulating layer 6. More specifically, the source electrode 7S and the drain electrode 7D are connected to the oxide semiconductor layer 5 via contact holes provided in the insulating layer 6, and disposed on the insulating layer 6 opposite each other at predetermined intervals in the horizontal direction of the substrate.

The source electrode 7S and the drain electrode 7D each include copper (Cu) as a main component, and have a stack structure of a copper film (Cu film) and a copper-manganese alloy film (CuMn alloy film). Specifically, the source electrode 7S is a stacked film formed by stacking a first film 71S that is the Cu film and a second film 72S that is the CuMn alloy film in this order from bottom to top.

In the same manner, the drain electrode 7D is a stacked film formed by stacking a first film 71D that is the Cu film and a second film 72D that is the CuMn alloy film in this order from bottom to top. It should be noted that the first films 71S and 71D which are the Cu films may preferably have a thickness greater than a thickness of the second films 72S and 72D.

In this manner, the use of a Cu film that is a low-resistance material as the source electrode 7S and the drain electrode 7D contributes to lower resistance of the source electrode 7S and the drain electrode 7D, and also contributes to lower resistance of a line formed on the second metal layer (line on the same layer as the source electrode 7S and the drain electrode 7D).

Furthermore, it is possible to prevent Cu atoms in the Cu film from oxidizing and causing alteration of the Cu film, by employing the CuMn alloy film as the uppermost layer (cap layer) of the source electrode 7S and the drain electrode 7D. This allows preventing higher resistance of the source electrode 7S and the drain electrode 7D due to Cu oxidation It should be noted that the CuMn alloy film as described herein is an alloy film of copper and manganese.

The insulating layer 8 is formed on the insulating layer 6 to cover the source electrode 7S and the drain electrode 7D. The insulating layer 8 is, for example, a single-layer film such as a silicon oxide ($SiO_2$) film or an aluminum oxide ($Al_2O_3$) film, or a stack of these oxide films.

The upper-layer wiring 9 is formed of a conductive film formed in a predetermined shape on the insulating layer 8, and connected to the drain electrode 7D via a contact hole formed through the insulating layer 8. The upper-layer wiring 9 according to the present embodiment is an ITO film formed of ITO.

The TFT substrate 1 according to the present embodiment is configured as described above. It should be noted that, although the source electrode 7S and the drain electrode 7D each have a two-layer structure of the CuMn alloy film and the Cu film according to the present embodiment, the present disclosure is not limited to this example.

Figure 5:
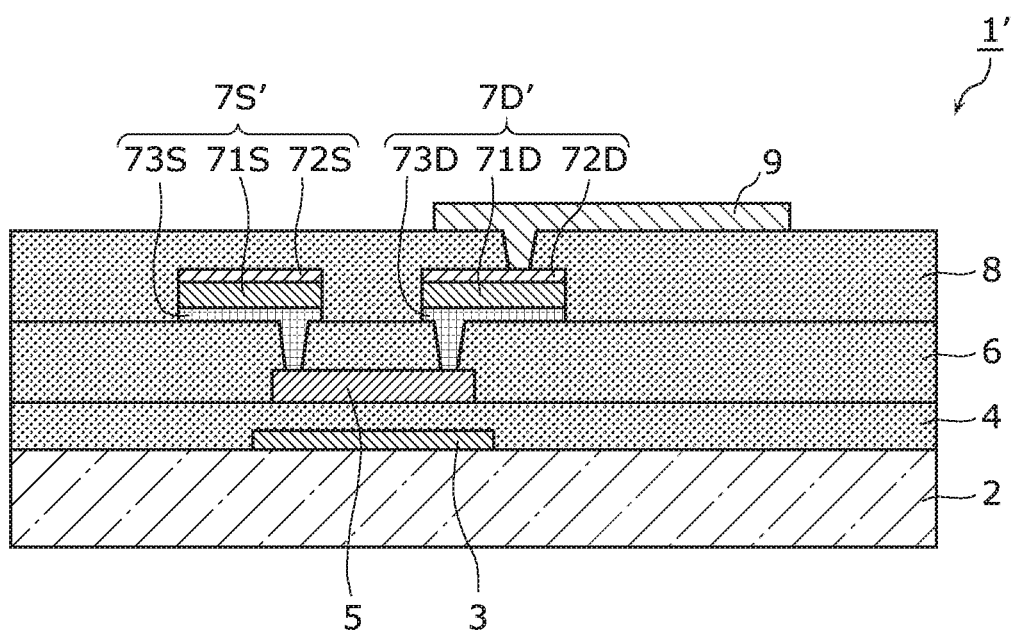
FIG. 5 is a schematic sectional view of a TFT substrate according to another embodiment.

For example, as illustrated in FIG. 5, a TFT substrate 1' including the source electrode 7S' and the drain electrode 7D' each having a three-layer structure may be exemplified. More specifically, the source electrode 7S' may be a stacked film of a third film 73S that is an Mo (molybdenum) film or the CuMn film, a first film 71S that is the Cu film, and a second film 72S that is the CuMn alloy film. In the same manner, the drain electrode 7D' may be a stacked film of a third film 73D that is the Mo film or the CuMn film, a first film 71D that is the Cu film, and a second film 72D that is the CuMn alloy film.

In this manner, the use of the CuMn film or the Mo film as the undermost layer of the source electrode 7S' and the drain electrode 7D', it is possible to decrease the possibility that Cu atoms in the second film (Cu film) diffuses into the layer under the second film, and also to enhance adhesion to the underlayer.

[A Surface Condition and an Atom Binding Condition of the CuMn Alloy Film]

The following describes in detail a result of analysis of a surface condition and an atom binding condition of the CuMn alloy film, together with how the underlying knowledge of the present invention has been obtained.

When physically connecting lines or electrodes between different wiring layers in the TFT substrate, a contact hole is formed through the insulating film (interlayer insulating film). In this case, when an ITO film in the wiring layer of an upper layer is to be formed on the CuMn alloy film in the wiring layer of a lower layer via the contact hole in the insulating film, a surface of the CuMn alloy film is exposed. In the TFT substrate 1 illustrated in FIG. 4, for example, when the second film 72D (CuMn alloy film) of the drain electrode 7D and the upper-layer wiring 9 (ITO film) are to be connected, a surface of the second film 72D is exposed after a contact hole is formed through the insulating layer 8.

In this case, a contact resistance between the ITO film and the CuMn alloy film increases with an increase in wait time from when the CuMn alloy film (second film 72D) is exposed to when the CuMn alloy film is covered by the ITO film (upper-layer wiring 9). This leads to a decrease in uniformity or reliability of display of the display panel.

The above-described change in the contact resistance is caused by oxidation of the exposed surface of the CuMn alloy film which occurs during the wait time before deposition of the ITO film. However, no conventional technique of observing the change in the contact resistance has been available as an in-line process, and thus it has not been possible to control the contact resistance of the surface of the CuMn alloy film. For that reason, it has been difficult to implement a TFT substrate with desired performance.

Figure 6:
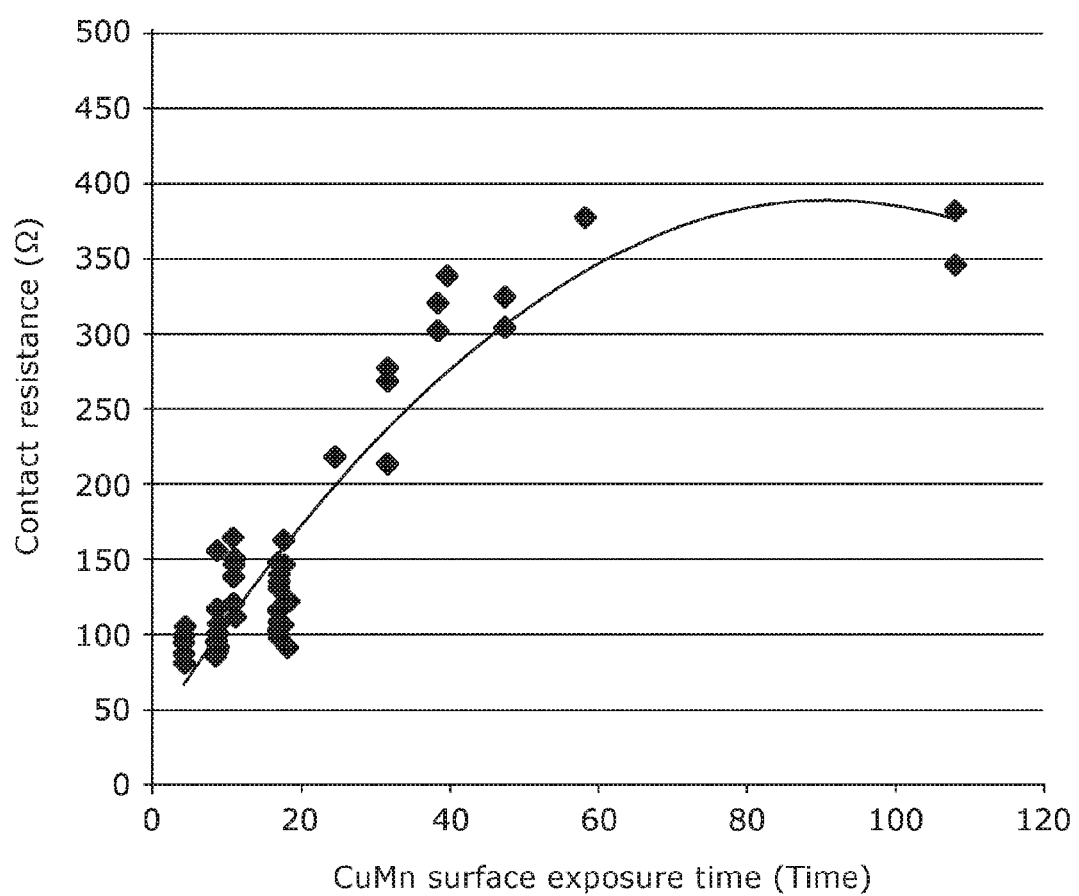
FIG. 6 is a diagram illustrating a relationship between a CuMn surface exposure time and a contact resistance in a CuMn alloy film and an ITO film.

In view of the above, the inventor first conducted an experiment regarding an amount of time from exposing the CuMn alloy film to depositing the ITO film (CuMn surface exposure time) and a contact resistance of the surface of the CuMn alloy film, and found out that there is a correlation as illustrated in FIG. 6 between the CuMn surface exposure time and the above-described contact resistance. FIG. 6 is a diagram illustrating a relationship between the CuMn surface exposure time and the contact resistance in the CuMn alloy film and an ITO film.

Specifically, as illustrated in FIG. 6, it has been found out that the contact resistance increases with an increase in the CuMn surface exposure time until the CuMn surface exposure time reaches a certain amount of time (approximately 60 hours), and the contact resistance is substantially unchanged after the CuMn surface exposure time exceeds the above-described certain amount of time (approximately 60 hours).

It should be noted that, in FIG. 6, the CuMn surface exposure time is a time period starting from removing a resist film when forming a contact hole through the insulating film (insulating layer 8) that covers the CuMn alloy film. The contact resistance is measured after the ITO film is deposited on the CuMn alloy film. More specifically, the contact resistance of the second film 72D (CuMn alloy film) of each of the drain electrodes 7D of the plurality of thin-film transistors Tr in the TFT substrate 1 illustrated in FIG. 4 is measured using a contact chain.

Figure 7:
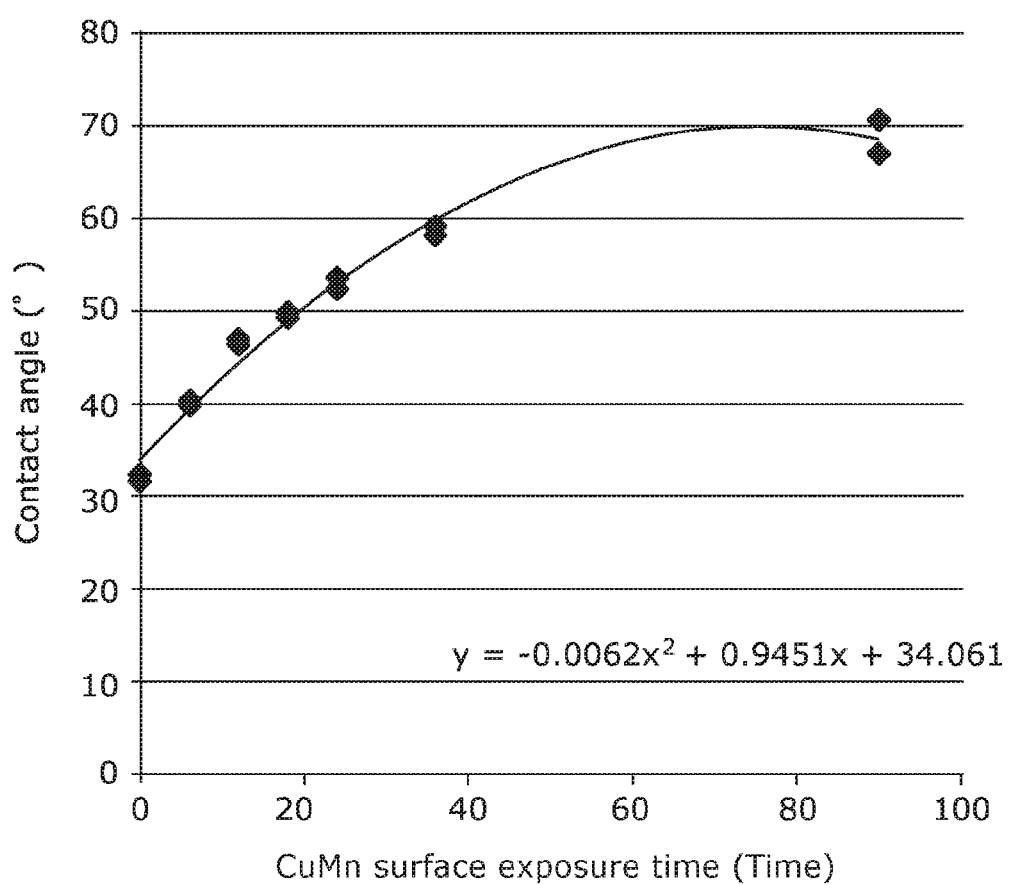
FIG. 7 is a diagram illustrating a relationship between the CuMn surface exposure time and a contact angle of a surface of the CuMn alloy film in the CuMn alloy film and the ITO film.

Furthermore, as a result of earnest investigation, the inventor has focused on a contact angle as an indicator of the surface condition of the CuMn alloy film, conducted an experiment regarding a relationship between the CuMn surface exposure time and the contact angle of the surface of the CuMn alloy film, and found out that there is a correlation as illustrated in FIG. 7 between the CuMn surface exposure time and the contact angle of the surface of the CuMn alloy film. FIG. 7 is a diagram illustrating a relationship between the CuMn surface exposure time and the contact angle of the surface of the CuMn alloy film in the CuMn alloy film and the ITO film.

Specifically, as illustrated in FIG. 7, it has been found out that the contact angle increases with an increase in the CuMn surface exposure time until the CuMn surface exposure time reaches a certain amount of time (approximately 60 hours), and the contact angle is substantially unchanged after the CuMn surface exposure time exceeds the above-described certain amount of time (approximately 60 hours). It should be noted that the contact angle is a contact angle with respect to water, and measured using a contact angle gauge.

In addition, the inventor has also analyzed not the surface condition (contact angle) but an atom binding condition (composition change) of the CuMn alloy film. This also shall be described below with reference to FIG. 8 and FIG. 9A to FIG. 9C.

Figure 8:
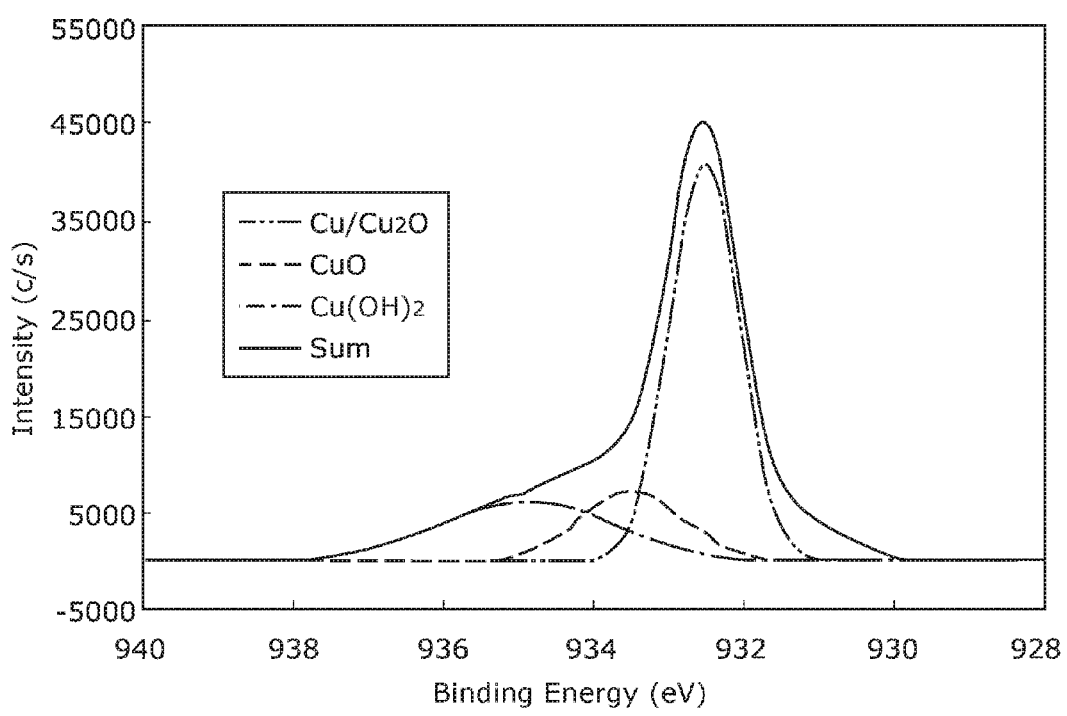
FIG. 8 is a diagram illustrating a result of analyzing the peak separation of Cu2p3/2 spectrum by X-ray photoemission spectroscopy (XPS) in the CuMn alloy film.

In this experiment, peak separation is performed assuming three Cu binding conditions of metal Cu (pure copper) or $Cu_2O$ (monovalent copper), CuO (divalent copper), and $Cu(OH)_2$ (divalent copper), and an abundance ratio (percent) of each binding condition is calculated. FIG. 8 illustrates a result of the calculation. FIG. 8 is a diagram illustrating a result of analyzing the peak separation of Cu2p3/2 spectrum by XPS in the CuMn alloy film.

Figure 9A:
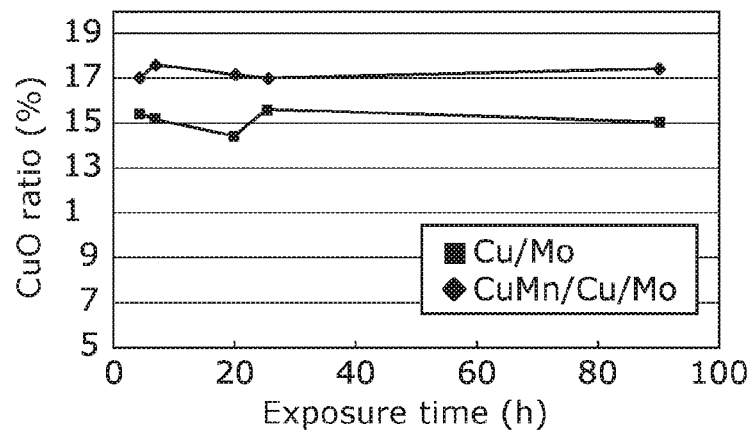
FIG. 9A is a diagram illustrating changes in an abundance ratio of CuO over exposure time.
Figure 9B:
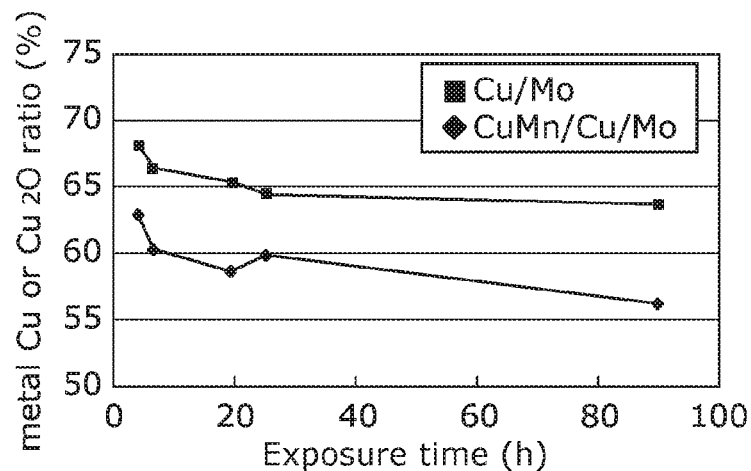
FIG. 9B is a diagram illustrating changes in an abundance ratio of metal Cu or $Cu_2O$ over exposure time.
Figure 9C:
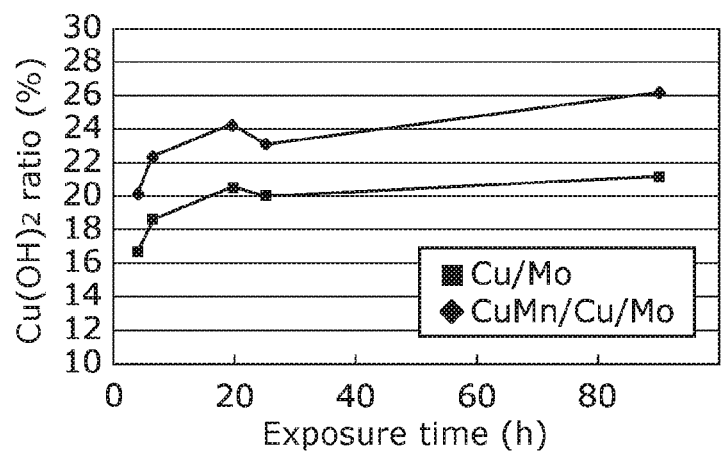
FIG. 9C is a diagram illustrating changes in an abundance ratio of $Cu(OH)_2$ over exposure time.

Change with the passage of time of the abundance ratio of each binding condition of Cu in a stacked film of the Cu film and the Mo film (Cu/Mo) and a stacked film of the CuMn alloy film, the Cu film, and the Mo film (CuMn/Cu/Mo) has been studied. FIG. 9A to FIG. 9C illustrate the results. FIG. 9A is a diagram illustrating changes in the abundance ratio of CuO over exposure time. FIG. 9B is a diagram illustrating changes in the abundance ratio of metal Cu or $Cu_2O$ over exposure time. FIG. 9C is a diagram illustrating changes in the abundance ratio of $Cu(OH)_2$ over exposure time. It should be noted that the exposure time in each of FIG. 9A to FIG. 9C is the above-described CuMn surface exposure time, and an elapsed time of exposure to atmosphere following removing the resist film when the contact hole is formed through the insulating film that covers the CuMn alloy film.

As illustrated in FIG. 9A, it has been found that the abundance ratio of CuO changes very little even when the exposure time changes. Furthermore, as illustrated in FIG. 9B, it has been found that the abundance ratio of metal Cu or $Cu_2O$ decreases as the exposure time proceeds.

As illustrated in FIG. 9C, it has been found that the abundance ratio of $Cu(OH)_2$ increases as the exposure time proceeds. More specifically, it has been found that the contact resistance of the CuMn alloy film increases due to oxidation as the exposure time (CuMn surface exposure time) proceeds.

It should be noted that, as illustrated in FIG. 9A to FIG. 9C, it has been found that there is a difference in the binding condition between Cu/Mo and CuMn/Cu/Mo. In addition, it has been found that the abundance ratio of each of the binding conditions of Cu/Mo and CuMn/Cu/Mo with respect to change in the exposure time has the same tendency.

Figure 10:
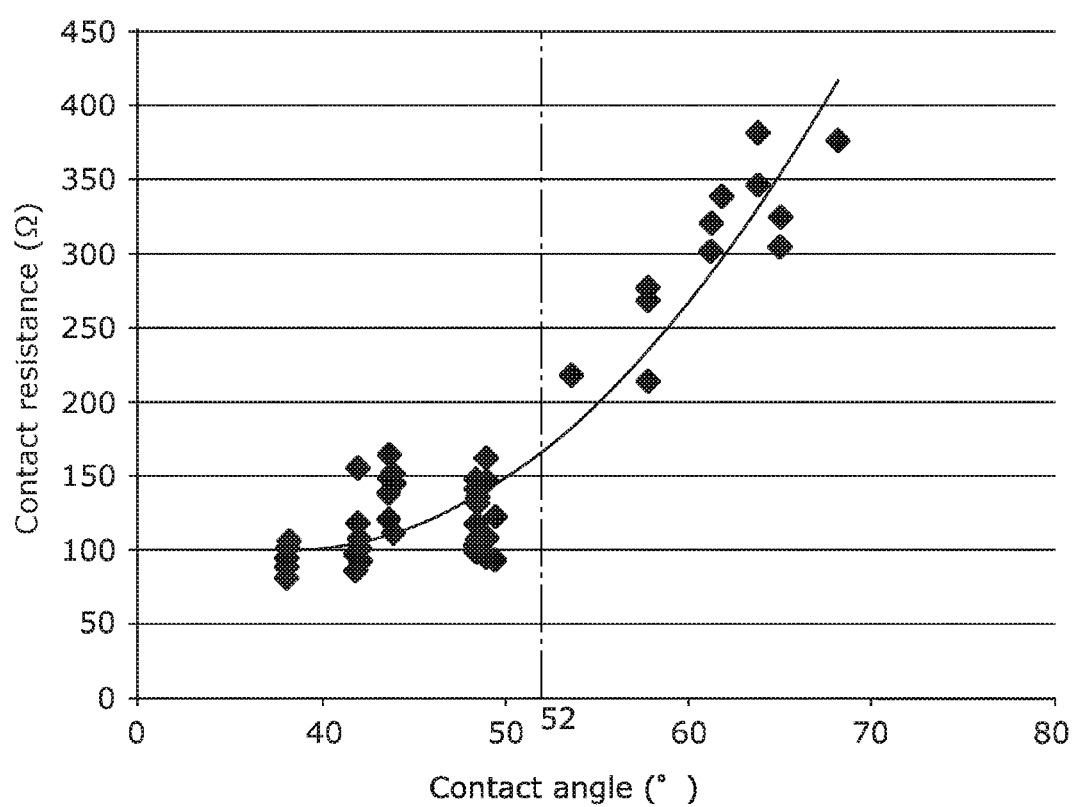
FIG. 10 is a diagram illustrating a relationship between a contact angle of a surface of a CuMn alloy film and a contact resistance of the surface of the CuMn alloy film.

The inventor has found out that there is a correlation between the contact angle of the surface of the CuMn alloy film and the contact resistance of the surface of the CuMn alloy film from the results of the experiments, and ascertained that there is a correlation as illustrated in FIG. 10. FIG. 10 is a diagram illustrating a relationship between the contact angle of the surface of the CuMn alloy film and the contact resistance of the surface of the CuMn alloy film.

As illustrated in FIG. 10, there is a correlation between the contact angle of the surface of the CuMn alloy film and the contact resistance of the surface of the CuMn alloy film, and it has been found out that the contact resistance of the surface of the CuMn alloy film increases with an increase in the contact angle of the CuMn alloy film. Furthermore, it has been found out that, when the contact angle of the CuMn alloy film becomes greater than 52 degrees, an ascending curve of the contact resistance increases the inclination, and the inclination of the contact resistance with respect to the contact angle becomes steep.

As described above, the present invention has been conceived on the basis of a new knowledge that there is a correlation between the contact angle of the surface of the CuMn alloy film and the contact resistance of the surface of the CuMn alloy film, and the inventor has found out, by monitoring the contact angle of the surface of the CuMn alloy film, that it is possible to control the contact resistance of the surface of the CuMn alloy film.

More specifically, the contact resistance of the surface of the CuMn alloy film is controlled by measuring the contact angle of the surface of the CuMn alloy film, and, on the basis of a pre-measured and pre-calculated correlation (for example, FIG. 10), as reference data, between the contact angle of the CuMn alloy film and a contact resistance of the surface of the CuMn alloy film, determining whether or not the contact angle of the CuMn alloy film obtained by actually measuring in a manufacturing process of a TFT substrate is less than or equal to a predetermined value. For example, it is possible to control the contact resistance of the surface of the CuMn alloy film to obtain a desired contact resistance, by in-line measuring the contact angle of the CuMn alloy film formed on the substrate and feeding back the in-line measured contact angle to the process.

[Method of Manufacturing the Thin-film Transistor Substrate]

The following describes a method of manufacturing the TFT substrate 1 according to the embodiment, using the above-described control on the contact resistance, with reference to FIG. 11A to FIG. 11M. FIG. 11A to FIG. 11M are cross-sectional views showing respective processes in the method of manufacturing the thin-film transistor substrate according to the embodiment.

The method of manufacturing the TFT substrate 1 according to the present embodiment is a method of manufacturing a TFT substrate including a TFT having a CuMn alloy film, and includes a control process in which a contact resistance of a surface of the CuMn alloy film is controlled on the basis of a contact angle of the surface of the CuMn alloy film.

Figure 11A:
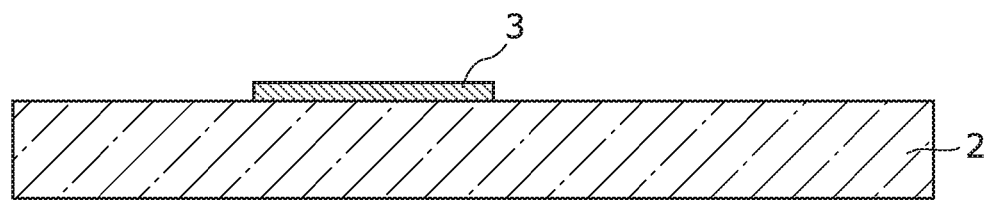
FIG. 11A is a sectional view illustrating a process of forming a gate electrode (first wiring layer) in a method of manufacturing the TFT substrate according to the embodiment.

Specifically, as illustrated in FIG. 11A, a substrate 2 is prepared, and a gate electrode 3 is formed in a predetermined shape above the substrate 2. For example, a gate metal film is deposited on the substrate 2 of a G8 glass substrate by sputtering, and the deposited gate metal film is processed by photolithography and wet etching to form the gate electrode 3 in a predetermined shape.

Figure 11B:
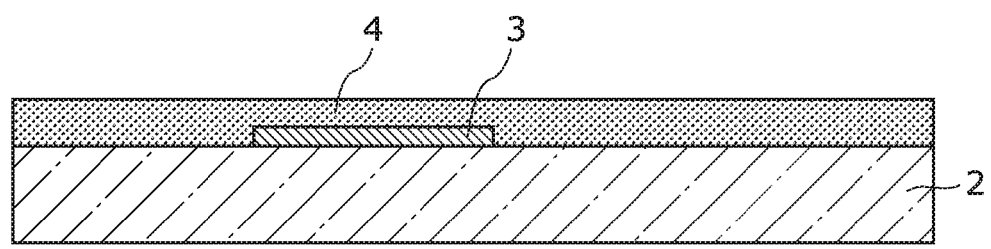
FIG. 11B is a sectional view illustrating a process of forming a first insulating film (gate insulating film) in the method of manufacturing the TFT substrate according to the embodiment.

Next, as illustrated in FIG. 11B, a gate insulating film 4 is formed above the substrate 2. For example, the gate insulating film 4 made of a silicon oxide is deposited by plasma CVD, etc., so as to cover the gate electrode 3.

Figure 11C:
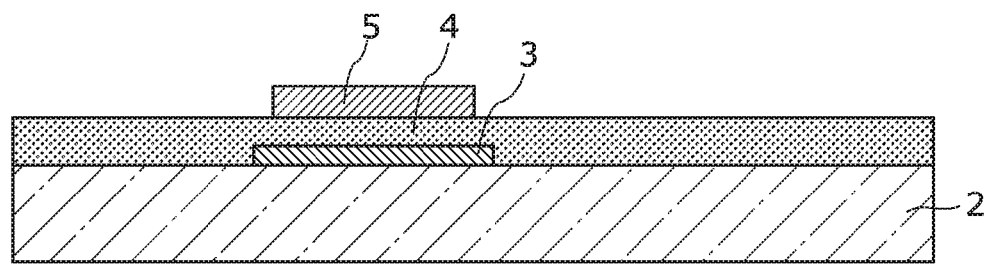
FIG. 11C is a sectional view illustrating a process of forming an oxide semiconductor layer in the method of manufacturing the TFT substrate according to the embodiment.

Next, as illustrated in FIG. 11C, an oxide semiconductor layer 5 is formed into a predetermined shape above the substrate 2. In the present embodiment, the oxide semiconductor layer 5 is formed on the gate insulating film 4.

For example, a transparent amorphous oxide semiconductor of $InGaZnO_x$ is deposited on the gate insulating film 4 by sputtering or the like, and the deposited transparent amorphous oxide semiconductor is processed by photolithography and etching, to form the oxide semiconductor layer 5 in the predetermined shape above the gate electrode 3.

Figure 11D:
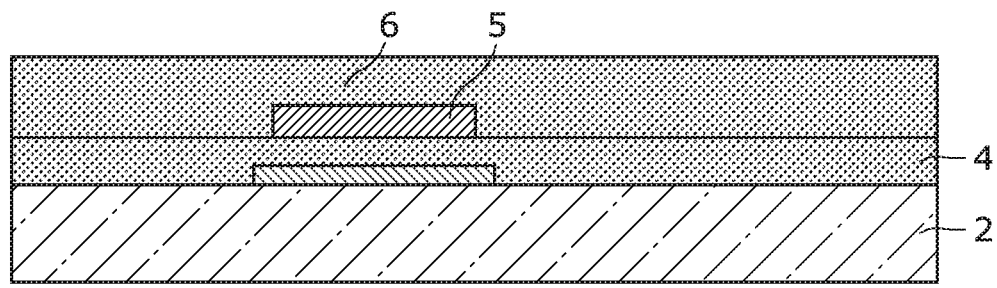
FIG. 11D is a sectional view illustrating a process of forming a second insulating film in the method of manufacturing the TFT substrate according to the embodiment.

Next, an insulating layer 6 is deposited on the gate insulating layer 4 to cover the oxide semiconductor layer 5, as illustrated in FIG. 11D. For example, the insulating layer 6 formed of a silicon oxide film is deposited by plasma CVD.

Figure 11E:
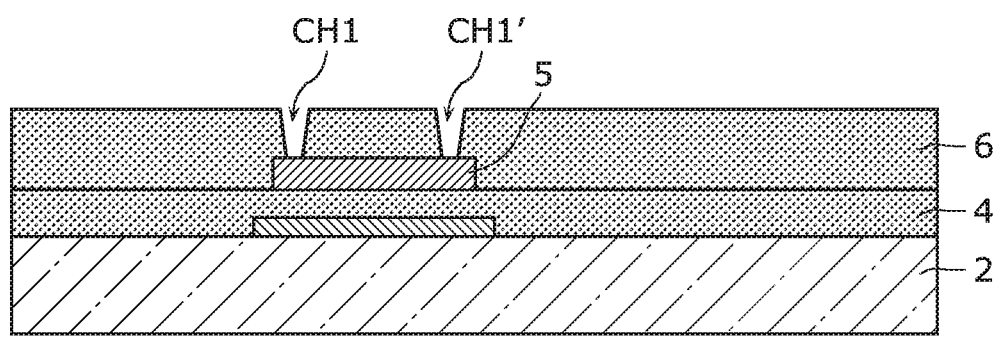
FIG. 11E is a sectional view illustrating a process of forming a contact hole in the method of manufacturing the TFT substrate according to the embodiment.

Next, as illustrated in FIG. 11E, part of the insulating layer 6 is removed to form contact holes CH1 and CH1' for establishing contact between the oxide semiconductor layer 5 and each of the source electrode 7S and the drain electrode 7D. For example, the contact holes CH1 and CH1' are formed through the insulating layer 6 by photolithography and etching so that part of the oxide semiconductor layer 5 is exposed.

Figure 11F:
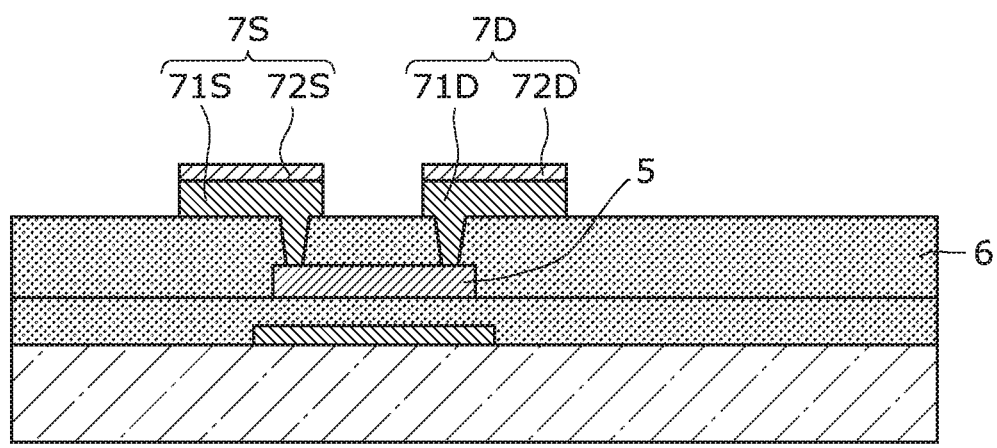
FIG. 11F is a sectional view illustrating a process of forming a source drain electrode (second wiring layer) in a method of manufacturing the TFT substrate according to the embodiment.

Next, as illustrated in FIG. 11F, the source electrode 7S and the drain electrode 7D are formed on the insulating layer 6 in predetermined shapes so as to connect to the oxide semiconductor layer 5.

More specifically, first, a Cu film is deposited by sputtering on the insulating layer 6 so as to fill in the contact holes CH1 and CH1' in the insulating layer 6, and a CuMn alloy film is deposed by sputtering on the Cu film.

Subsequently, a stacked film of the Cu film and the CuMn alloy film is processed into a predetermined shape by photolithography and etching. According to the present embodiment, the CuMn alloy film and the Cu film are processed to be patterned by wet etching using hydrogen peroxide solution as etchant.

With this, it is possible to form the source electrode 7S having a stack structure of the first film 71S which is a Cu film and a second film 72S which is a CuMn, and the drain electrode 7D having a stack structure of the first film 71D which is a Cu film and the second film 72D which is the CuMn.

Figure 11G:
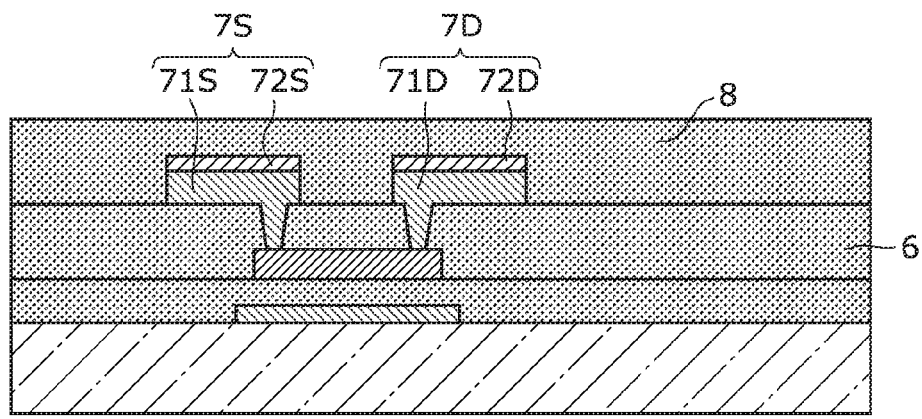
FIG. 11G is a sectional view illustrating a process of forming a third insulating film in the method of manufacturing the TFT substrate according to the embodiment.

Next, as illustrated in FIG. 11G, the insulating layer 8 is formed on the insulating layer 6 so as to cover the source electrode 7S and the drain electrode 7D. More specifically, the insulating layer 8 is deposited on the second films 72S and 72D which are CuMn alloy films. For example, the insulating layer 8 formed of a silicon oxide film is deposited at a film depositing temperature of 300 degrees Celsius by plasma CVD.

Next, as illustrated in FIG. 11H to FIG. 11M, the upper-layer wiring 9 is formed in a predetermined shape on the insulating layer 8 so as to connect to the drain electrode 7D via a contact hole of the insulating layer 8.

First, a contact hole is formed through the insulating layer 8 to expose the second films 72S and 72D which are CuMn alloy films.

Figure 11H:
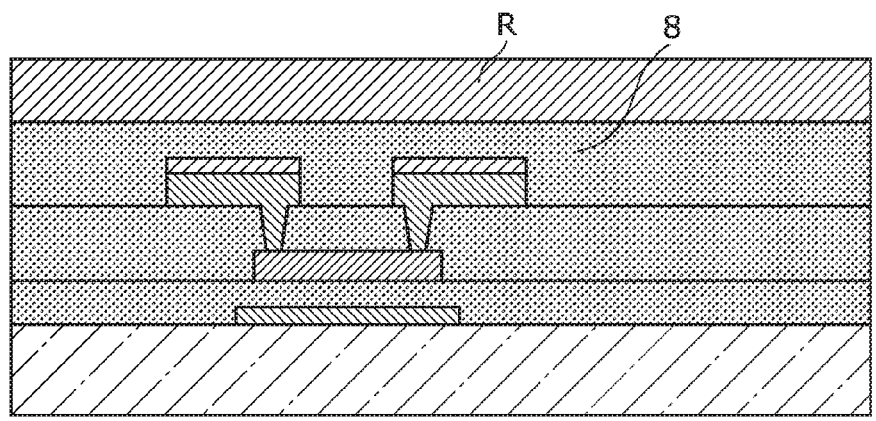
FIG. 11H is a sectional view illustrating a process of forming a resist film in the method of manufacturing the TFT substrate according to the embodiment.
Figure 11I:
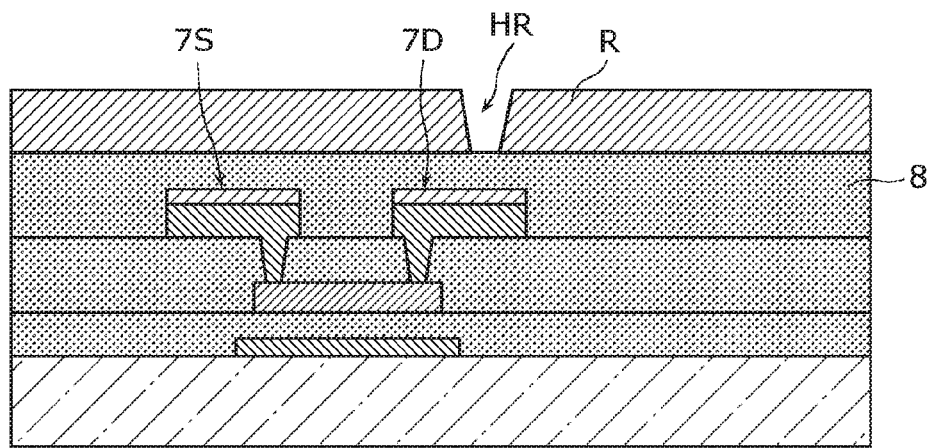
FIG. 11I is a sectional view illustrating a process of forming a resist film patterning in the method of manufacturing the TFT substrate according to the embodiment.
Figure 11J:
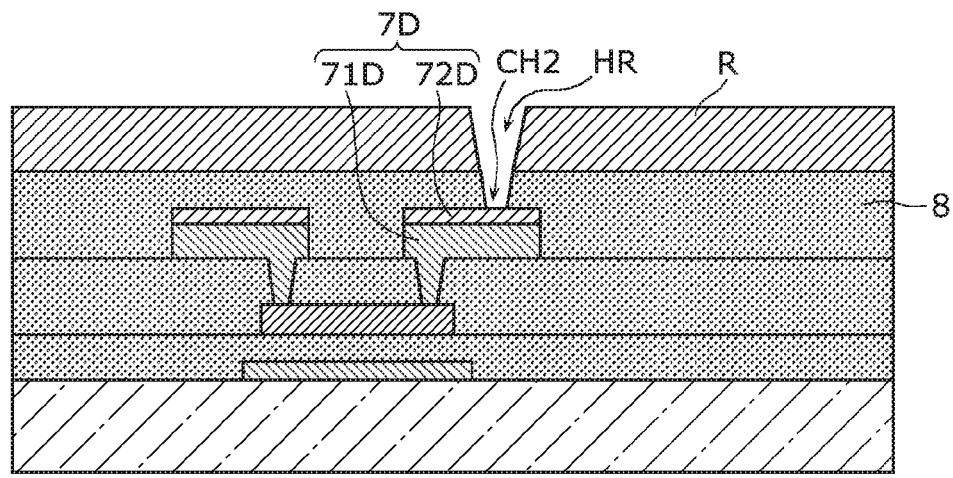
FIG. 11J is a sectional view illustrating a process of forming a contact hole in the method of manufacturing the TFT substrate according to the embodiment.
Figure 11K:
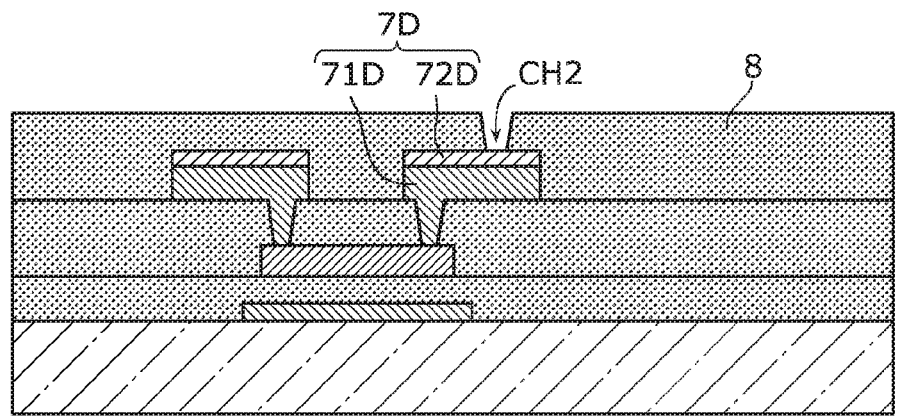
FIG. 11K is a sectional view illustrating a process of removing a resist film in the method of manufacturing the TFT substrate according to the embodiment.

More specifically, as illustrated in FIG. 11H, a resist film R is formed on the insulating layer 8, and the resist film R is exposed by photolithography to form a through-hole HR through the resist film R above the drain electrode 7D as illustrated in FIG. 11I. Subsequently, as illustrated in FIG. 11J, the contact hole CH2 is formed through the insulating layer 8 by selectively removing a portion corresponding to the through-hole HR in the insulating layer 8 by etching, to expose the surface of the drain electrode 7D. In this manner, the surface of the second film 72D (CuMn alloy film) which is the uppermost layer of the drain electrode 7D is exposed. It should be noted that, although the contact hole CH2 is formed by dry etching according to the present embodiment, wet etching may be used. Subsequently, as illustrated in FIG. 11K, the resist film R is removed using peeling solution such as an alkali solution.

Next, a contact resistance of the surface of the CuMn alloy film is controlled on the basis of the contact angle of the surface of the CuMn alloy film (control process). In the control process, the contact resistance of the surface of the CuMn alloy film is controlled on a basis of a pre-calculated correlation (for example, FIG. 10) between the contact angle of the surface of the CuMn alloy film and the contact resistance of the surface of the CuMn alloy film. For example, the control process includes: measuring the contact angle of the surface of the CuMn alloy film; and determining whether or not the contact angle which has been measured is less than or equal to a predetermined value.

Figure 11L:
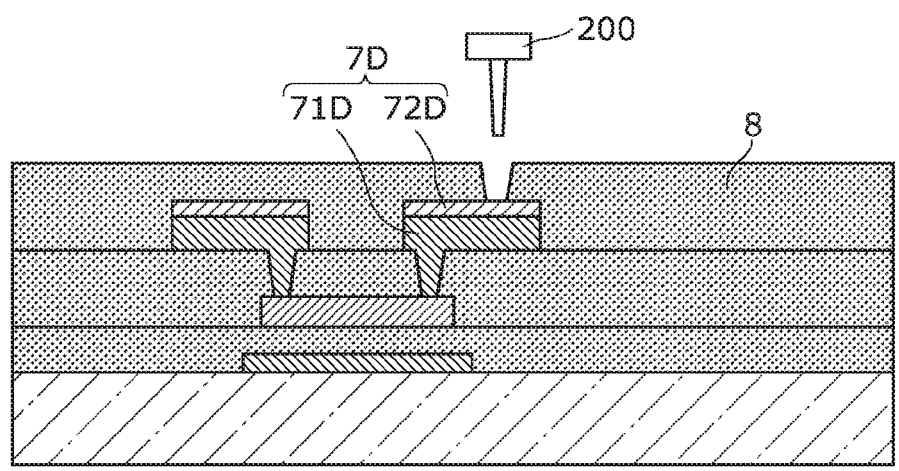
FIG. 11L is a sectional view illustrating a process of measuring a contact angle in the method of manufacturing the TFT substrate according to the embodiment.

According to the present embodiment, as illustrated in FIG. 11L, the contact angle of the surface of the drain electrode 7D which has been exposed is measured using a contact angle gauge 200 More specifically, the contact angle of the surface of the CuMn alloy film which is located in the uppermost layer of the drain electrode 7D and is exposed from the contact hole CH2 of the insulating layer 8 is measured (contact angle measuring process).

Subsequently, whether or not the measured contact angle is less than or equal to a predetermined value is determined (determining process). At this time, when the contact angle which has been measured is determined to be greater than the predetermined value, the surface of the CuMn alloy film is cleaned (cleaning process).

In the cleaning process, the surface of the CuMn alloy film is cleaned using, for example, an alkali solution. It should be noted that, when the surface of the CuMn alloy film is cleaned, it is possible, as cleaning solution, to use the same solution as the peeling solution of the above-described resist film R. As described above, it is possible to remove a residue such as the resist film R that is left on the surface of the CuMn alloy film, by cleaning again the surface of the CuMn alloy film. In this manner, it is possible to reduce the contact angle of the surface of the CuMn alloy film, and also reduce the contact resistance of the CuMn alloy film.

It should be noted that, as illustrated in FIG. 10, when the contact angle of the CuMn alloy film becomes greater than 52 degrees, an ascending curve of the contact resistance increases the inclination, and thus the predetermined value of the contact angle in the above-described determining process may preferably be set to 52 degrees. In other words, when the measured contact angle is greater than 52 degrees, the contact resistance is controlled such that the contact angle becomes less than or equal to 52 degrees, by cleaning the surface of the CuMn alloy film, or the like. In this manner, it is possible to easily control the contact resistance, by performing the determining, setting a threshold to the contact angle of 52 degrees of the CuMn alloy film having a small ascending curve. More specifically, in a region where the inclination of the contact resistance with respect to the contact angle becomes steep, a fluctuating range of the contact resistance with respect to a unit contact angle increases, making it difficult to control the contact resistance.

Figure 11M:
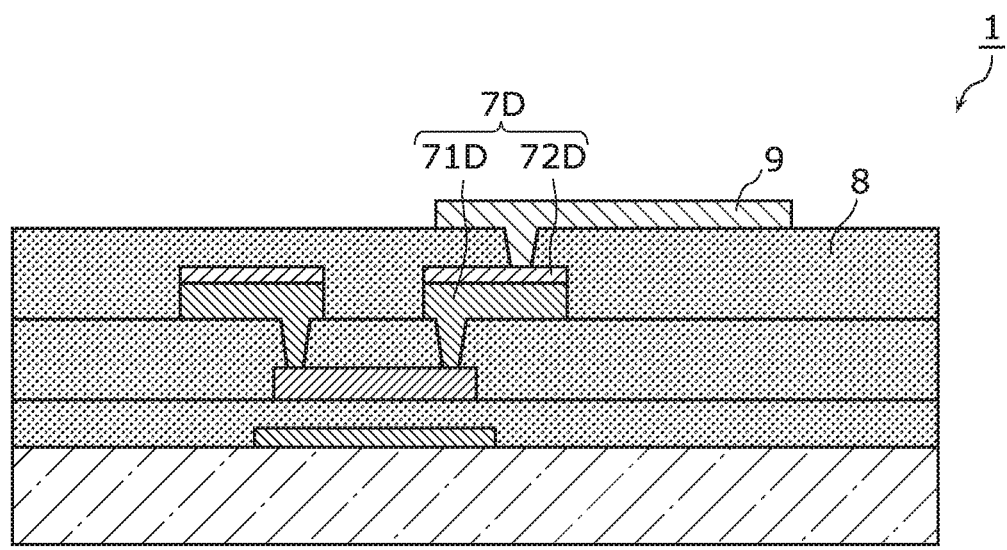
FIG. 11M is a sectional view illustrating a process of forming a third wiring layer in the method of manufacturing the TFT substrate according to the embodiment.

Next, the upper-layer wiring 9 which is an ITO film is formed on the second film 72D which is a CuMn alloy film, via the contact hole CH2 of the insulating layer 8. More specifically, as illustrated in FIG. 11M, the upper-layer wiring 9 is formed in a predetermined shape on the insulating layer 8, by depositing an ITO film by sputtering on the insulating layer 8 to fill in the contact hole CH2 of the insulating layer 8, and processing the ITO film by photolithography and etching. According to the present embodiment, the ITO film has been processed to be patterned by wet etching using oxalic acid series etchant.

The method of manufacturing the TFT substrate 1 according to the present embodiment as described above includes the control process in which the contact resistance of the surface of the CuMn alloy film is controlled on the basis of the contact angle of the surface of the CuMn alloy film. With this, it is possible to implement a TFT substrate with desired performance.

Modification Example, etc.

The thin-film transistor substrate, the method of manufacturing the thin film transistor, and the organic EL display device have been described above based on the embodiment, the present invention is not limited to the above-described embodiment.

Figure 12:
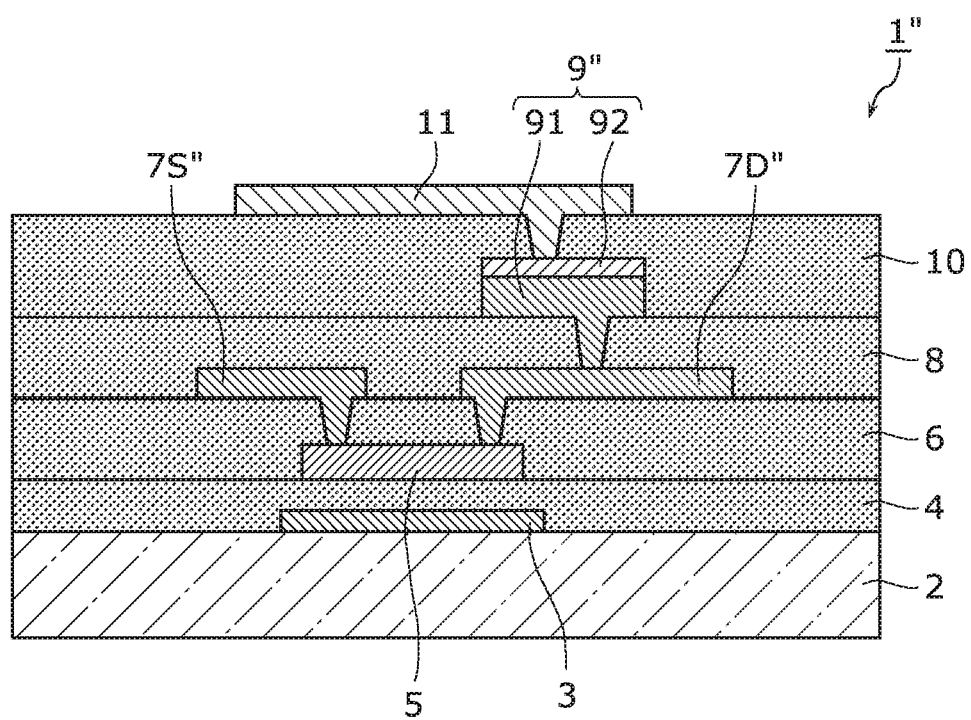
FIG. 12 is a schematic sectional view of a TFT substrate according to a modification example.

For example, although the source electrode and the drain electrode have been exemplified as components having the CuMn alloy film in the TFT substrate according to the above-described embodiment, the present disclosure is not limited to this example. For example, a component having the CuMn alloy film may be an intermediate wiring 9" as in a TFT substrate 1" having a four-layer wiring structure illustrated in FIG. 12. More specifically, in the TFT substrate 1" illustrated in FIG. 12, a source electrode 7S" and a drain electrode 7D" are Cu films including pure copper, and the intermediate wiring 9" (third wiring layer), an insulating layer 10 (third insulating layer), and an upper-layer wiring 11 (fourth wiring layer) are further included. The intermediate wiring 9" has a stack structure of the first film 91 which is a Cu film and the second film 92 which is a CuMn alloy film. The insulating layer 10 includes a resin material such as an acrylic resin, or an inorganic material such as a silicon oxide film, and is formed on the insulating layer 8 to cover the intermediate wiring 9". The upper-layer wiring 11 is an ITO film formed in a predetermined shape on the insulating layer 8, and connected to the drain electrode 7D" via a contact hole formed through the insulating layer 8.

Although the contact resistance is a contact resistance between the CuMn alloy film and the ITO film in the above-described embodiment, the present disclosure is not limited to this example. For example, it is possible to control the contact resistance by measuring the contact angle of the surface of the CuMn alloy film, even when the contact resistance is a contact resistance between the CuMn alloy film and a conductive film formed on the CuMn alloy film.

In addition, although CuMn alloy film has a stack structure of the CuMn alloy film and the Cu film in the above-described embodiment, the present disclosure is not limited to this example. For example, the CuMn alloy film may be a line or an electrode of a single-layer film.

Although the foregoing embodiment describes the case where the thin-film transistor has a bottom-gate structure, the thin-film transistor may have a top-gate structure.

Although the foregoing embodiment describes the case where the thin-film transistor has a channel-etching-stopper (channel-protection) structure, the thin-film transistor may have a channel-etching structure. In other words, the insulating layer 6 in the foregoing embodiment may be omitted.

Although the foregoing embodiment describes an organic EL display device as the display device including the thin-film transistor substrate, the thin-film transistor substrate according to the above-described embodiment is applicable to any other display devices including an active matrix substrate, such as a liquid crystal display device.

The display device (display panel) such as an organic EL display device described above may be used as a flat panel display, and is applicable to all kinds of electronics having display panels, such as television sets, personal computers, and mobile phones. The disclosed technique is particularly suitable for large-screen, high-resolution display devices.

Other modifications obtained by applying various changes conceivable by a person skilled in the art to the embodiments and modifications and any combinations of the structural elements and functions in the embodiments and modifications without departing from the scope of the present disclosure are also included in the present invention.

INDUSTRIAL APPLICABILITY

The technique disclosed herein is widely usable, for example, in thin-film transistor substrates including oxide semiconductors and manufacturing methods thereof, and display devices such as organic EL display devices including thin-film transistor substrates.

REFERENCE SIGNS LIST 1, 1', 1" TFT substrate
2 substrate
3, G1, G2 gate electrode
4 gate insulating film
5 oxide semiconductor layer
6, 8, 10 insulating layer
7S, 7S', 7S", S1, S2 source electrode
7D, 7D', 7D", D1, D2 drain electrode
9, 11 upper-layer wiring
9" intermediate wiring
100 organic EL display device
110 pixel
110R, 110G, 110B sub pixel
111 bank
120 pixel circuit
130 organic EL element
131 anode
132 EL layer
133 cathode
140 gate line
150 source line
160 power line
200 contact angle gauge
SwTr, DrTr thin-film transistor
C capacitor
CH1, CH1', CH2 contact hole
HR through-hole

The invention claimed is:

1. A method of manufacturing a thin-film transistor substrate including a thin-film transistor having a CuMn alloy film, the method comprising:
forming the CuMn alloy film; and
controlling a contact resistance of a surface of the CuMn alloy film on a basis of a contact angle of the surface of the CuMn alloy film, wherein
in the controlling, the contact resistance of the surface of the CuMn alloy film is controlled on a basis of a pre-calculated correlation between the contact angle of the surface of the CuMn alloy film and the contact resistance of the surface of the CuMn alloy film.

2. The method of manufacturing the thin-film transistor substrate according to claim 1, further comprising:
depositing an insulating layer on the CuMn alloy film;
exposing the CuMn alloy film by forming a contact hole through the insulating layer; and
forming an ITO film on the CuMn alloy film via the contact hole, wherein
the controlling is performed between the exposing and the forming of the ITO film.

3. The method of manufacturing the thin-film transistor substrate according to claim 1, wherein the contact angle is between 40 and 65 degrees.

4. The method of manufacturing the thin-film transistor substrate according to claim 1, wherein the contact angle is a contact angle with respect to water.

5. The method of manufacturing the thin-film transistor substrate according to claim 1, further comprising:
depositing an insulating layer on the CuMn alloy film; and
exposing the CuMn surface for a predetermined period of time,
wherein the predetermined period of time is a time period starting from removing a resist film when forming a contact hole through the insulating layer.

6. The method of manufacturing the thin-film transistor substrate according to claim 1, wherein the contact angle of the surface of the CuMn alloy film is a surface exposed from a contact hole of an insulating layer.

7. A method of manufacturing a thin-film transistor substrate including a thin-film transistor having a CuMn alloy film, the method comprising:
forming the CuMn alloy film; and
controlling a contact resistance of a surface of the CuMn alloy film on a basis of a contact angle of the surface of the CuMn alloy film, wherein
the controlling includes:
measuring the contact angle of the surface of the CuMn alloy film; and
determining whether or not the contact angle which has been measured is less than or equal to a predetermined value.

8. The method of manufacturing the thin-film transistor substrate according to claim 7, wherein
the predetermined value of the contact angle is 52 degrees.

9. The method of manufacturing the thin-film transistor substrate according to claim 7, wherein
when the contact angle which has been measured is determined to be greater than the predetermined value in the determining, the controlling further includes cleaning the surface of the CuMn alloy film.

10. The method of manufacturing the thin-film transistor substrate according to claim 9, wherein
in the cleaning, the surface of the CuMn alloy film is cleaned using an alkali solution.

11. The method of manufacturing the thin-film transistor substrate according to claim 7, wherein the contact angle is a contact angle with respect to water.

12. The method of manufacturing the thin-film transistor substrate according to claim 7, wherein the contact angle is between 40 and 65 degrees.

13. The method of manufacturing the thin-film transistor substrate according to claim 7, further comprising:
depositing an insulating layer on the CuMn alloy film; and
exposing the CuMn surface for a predetermined period of time,
wherein the predetermined period of time is a time period starting from removing a resist film when forming a contact hole through the insulating layer.

14. The method of manufacturing the thin-film transistor substrate according to claim 7, wherein the contact angle of the surface of the CuMn alloy film is a surface exposed from a contact hole of an insulating layer.

15. A method of manufacturing a thin-film transistor substrate including a thin-film transistor having a CuMn alloy film, the method comprising:
forming the CuMn alloy film; and
controlling a contact resistance of a surface of the CuMn alloy film on a basis of a contact angle of the surface of the CuMn alloy film, wherein
the CuMn alloy film is located in an uppermost layer of each of a source electrode and a drain electrode of the thin-film transistor.

16. The method of manufacturing the thin-film transistor substrate according to claim 15, wherein the contact angle is a contact angle with respect to water.

17. The method of manufacturing the thin-film transistor substrate according to claim 15, wherein the contact angle is between 40 and 65 degrees.

18. The method of manufacturing the thin-film transistor substrate according to claim 15, further comprising:
   depositing an insulating layer on the CuMn alloy film; and
   exposing the CuMn surface for a predetermined period of time,
   wherein the predetermined period of time is a time period starting from removing a resist film when forming a contact hole through the insulating layer.

19. The method of manufacturing the thin-film transistor substrate according to claim 15, wherein the contact angle of the surface of the CuMn alloy film is a surface exposed from a contact hole of an insulating layer.

* * * * *